(12) United States Patent  
Nigo et al.

(10) Patent No.: US 11,393,969 B2  
(45) Date of Patent: Jul. 19, 2022

(54) THERMOELECTRIC GENERATION CELL AND THERMOELECTRIC GENERATION MODULE

(71) Applicant: NATIONAL INSTITUTE FOR MATERIALS SCIENCE, Tsukuba (JP)

(72) Inventors: Seisuke Nigo, Tsukuba (JP); Terumi Nakamura, Tsukuba (JP); Susumu Meguro, Tsukuba (JP); Seiichi Kato, Tsukuba (JP)

(73) Assignee: National Institute for Materials Science, Tsukuba (JP)

( * ) Notice: Subject to any disclaimer, the term of this patent is extended or adjusted under 35 U.S.C. 154(b) by 0 days.

(21) Appl. No.: 16/498,892

(22) PCT Filed: Feb. 27, 2018

(86) PCT No.: PCT/JP2018/007286  
§ 371 (c)(1),  
(2) Date: Jan. 28, 2021

(87) PCT Pub. No.: WO2018/180131  
PCT Pub. Date: Oct. 4, 2018

(65) Prior Publication Data  
US 2021/0202817 A1 Jul. 1, 2021

(30) Foreign Application Priority Data

Mar. 28, 2017 (JP) .............................. JP2017-062086  
Feb. 6, 2018 (JP) .............................. JP2018-019037

(51) Int. Cl.  
*H01L 35/32* (2006.01)  
*H01L 35/20* (2006.01)

(52) U.S. Cl.  
CPC .............. *H01L 35/32* (2013.01); *H01L 35/20* (2013.01)

(58) Field of Classification Search  
CPC ................................. H01L 35/32; H01L 35/20  
See application file for complete search history.

(56) References Cited

U.S. PATENT DOCUMENTS

| 3,064,064 A | * | 11/1962 | Jones ...................... H01L 35/08 136/203 |
| 2003/0116869 A1 | * | 6/2003 | Siu ......................... H01L 35/20 257/653 |
| 2016/0247995 A1 | | 8/2016 | Gouko et al. |

FOREIGN PATENT DOCUMENTS

| JP | 6-260686 A | 9/1994 |
| JP | 11-177154 A | 7/1999 |

(Continued)

OTHER PUBLICATIONS

Tohmyoh et al., "A plate-type thermoelectric power generator with an oxidized bi-metal interface for power generation from a small temperature difference", Microelectronic Engineering, 159, (2016), pp. 38-41. (Year: 2016).*

(Continued)

*Primary Examiner* — Tamir Ayad  
(74) *Attorney, Agent, or Firm* — Saliwanchik, Lloyd & Eisenschenk

(57) ABSTRACT

[Object] To provide a thermoelectric generation cell using a safe and inexpensive general-purpose thermoelectric material.  
[Solving Means] A thermoelectric generation cell, including: a fire-resistant-material frame (310) that holds a plurality of stacked thermoelectric generation units in a state of being insulated from adjacent thermoelectric generation units with each other; a heating section (311) of a plurality of stacked bodies of the thermoelectric generation units, the heating section being provided to the fire-resistant-material frame; and first and second cooling insulation oil sections (312*a* and 312*b*) that are provided at both sides of the fire-resistant- (Continued)

material frame, the first and second cooling insulation oil portions (312*a* and 312*b*) being provided on sides of first and second cooling sections of the thermoelectric generation units, the thermoelectric generation cell having a structure in which the thermoelectric generation units are bridged while being extended between the first cooling insulation oil section, the fire-resistant-material frame, and the second cooling insulation oil section.

5 Claims, 7 Drawing Sheets

(56) References Cited

FOREIGN PATENT DOCUMENTS

| JP | 2013-16685 A | 1/2013 |
|----|--------------|--------|
| JP | 2015-84364 A | 4/2015 |
| JP | 2015-233063 A | 12/2015 |
| JP | 2016-63075 A | 4/2016 |

OTHER PUBLICATIONS

Supplementary European Search Report dated Dec. 22, 2020 in European Application No. 18775937.8.
International Search Report in International Application No. PCT/JP2018/007286, filed Feb. 27, 2018.
Hakko Electric Co., Ltd. Heat laboratory-3rd, Nov. 2004, Internet <URL:http://www.hakko.co.jp>, along with an English translation.
Office Action dated Feb. 18, 2020 in Japanese Application No. 2019-509025, along with its English translation.
Office Action dated Aug. 4, 2020 in Japanese Application No. 2019-509025, along with its English translation.

* cited by examiner

FIG.4A
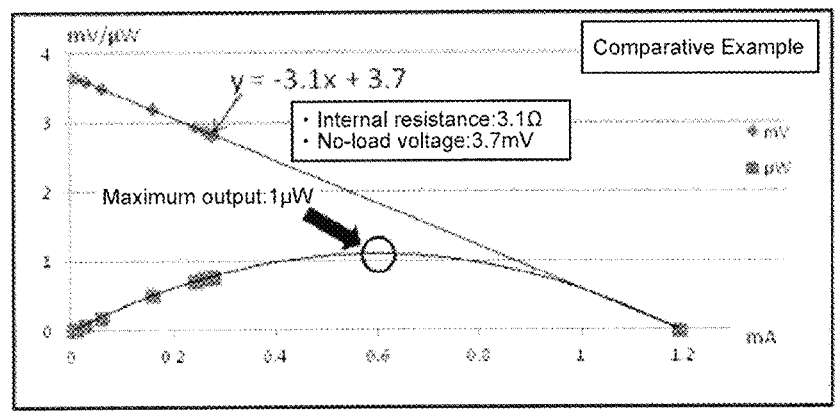
FIG.4B
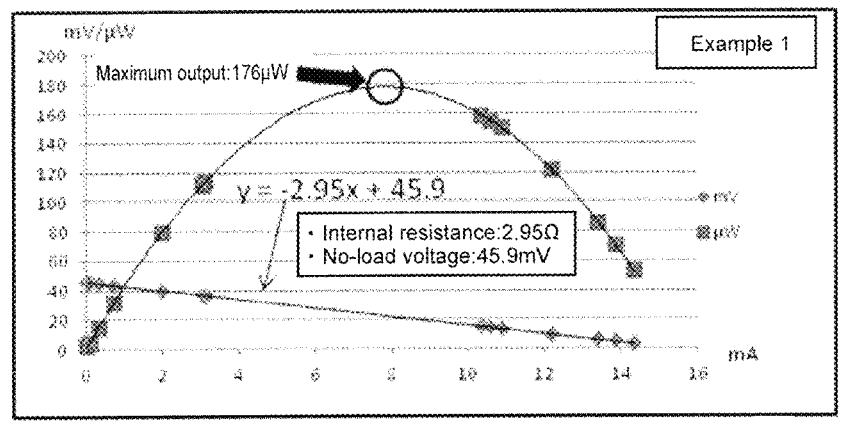
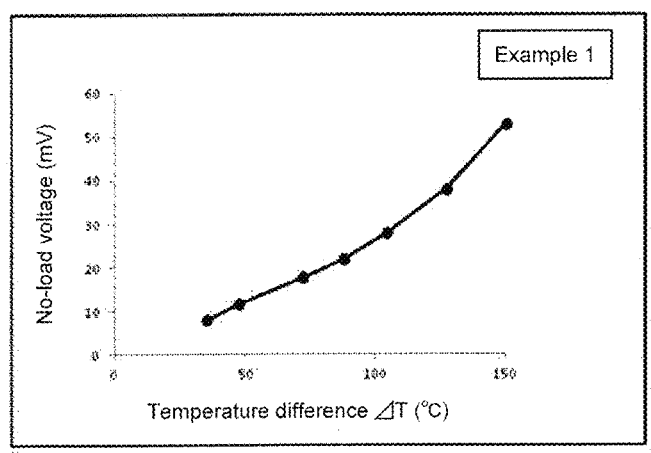
FIG.5

THERMOELECTRIC GENERATION CELL AND THERMOELECTRIC GENERATION MODULE

CROSS-REFERENCE TO RELATED APPLICATIONS

This application is the U.S. national stage application of International Patent Application No. PCT/JP2018/007286, filed Feb. 27, 2018, which claims the benefit under 35 U.S.C. § 119 of Japanese Application Nos. 2017-062086, filed Mar. 28, 2017; and 2018-019037, filed Feb. 6, 2018, the disclosures of each of which are incorporated herein by reference in their entirety.

TECHNICAL FIELD

The present invention relates to a device structure of thermoelectric conversion using a metal thermoelectric material.

BACKGROUND ART

Converting unused waste heat into electricity to reduce the environmental load is a demand of the times, and it is well known that an electromotive force is generated by applying a temperature difference to two types of dissimilar metals or both ends of a semiconductor by the Seebeck effect that directly converts thermal energy into electricity.

For example, in a semiconductor thermoelectric material, carriers (electrons and holes) with increased kinetic energy in a high temperature portion diffuse to a lower temperature portion to generate an electromotive force. Since the potential difference is reversed between an n-type semiconductor and a p-type semiconductor, a large electromotive force can be achieved (e.g., Patent Literature 1) by connecting π-type (p-n-p) structures in series. In the π-type structure, the n-type semiconductor and the p-type semiconductor are alternately connected via a metal electrode.

Since electrons are carries of electricity as well as carries of heat, the thermoelectric material has two characteristics of low thermal conductivity and large electrical conductivity. However, the two characteristics are in a trade-off relationship. For this reason, a bismuth tellurium alloy ($Bi_2Te_3$) having the two characteristics is used as the thermoelectric material in spite of being harmful.

In the metal thermoelectric material, since carries are only electrons, the device structure thereof is different from that of the semiconductor thermoelectric material. However, similarly in both of the thermoelectric materials, power is generated by the Seebeck effect. The kinetic energy of the electrons increases in a high temperature portion and diffuses to a lower temperature side, thereby causing the Seebeck effect to occur.

As a new technology using a metal thermoelectric material, a thermoelectric generation module in which a thermoelectric material and a metal are alternately graded-joined and processed into a tube and orientation of heat flow and current are made orthogonal to each other is disclosed in Patent Literature 2. In this technology, in the case of applying a temperature difference between the inside of the thermoelectric generation tube and the surface, since heat is preferentially transferred through the metal layer having thermal conductivity higher than that of the thermoelectric material layer, a z-axis direction component is generated in the temperature gradient of each thermoelectric material layer. For this reason, in each thermoelectric material layer, an electromotive force in the z-axis direction is generated by the Seebeck effect, and the electromotive force is superimposed in series in the stacked body. In the case where the graded angle and dimension of the stacked layers are optimized to stabilize the heat flow between the stacked layers, a large potential difference is generated between an electrode inside the tube and an electrode on the surface of the tube as a whole. Regarding the thermoelectric material used for the thermoelectric generation tube, it is described that any metal can be used as long as it has a Seebeck coefficient of not less than 30 µV/K and an electrical resistivity of not more than 10 mΩ·cm.

However, since the above-mentioned stacked layers of the thermoelectric generation tube are not insulated and have an electrically integrated structure, in the case where heat flow fluctuates in a micro manner, ineffective current is generated between the stacked layers and the thermoelectric conversion efficiency is reduced. Therefore, in Examples of the thermoelectric generation tube, $Bi_2Te_3$ having excellent thermoelectric characteristics is used as usual, and a Te compound such as $Bi_2Te_3$ requires careful handling because it is harmful to human bodies.

Meanwhile, although a thermoelectric material that has no problem in safety is used for a thermocouple used for temperature measurement, thermoelectric generation using the thermoelectric material has not been achieved.

In principle, it is possible to use the thermoelectric material of the thermocouple to perform thermoelectric generation. However, in the case where thermocouples are connected in series, the internal resistance increases while the voltage increases. Therefore, as seen in Non-Patent Literature 1, it has been considered difficult to develop a practical thermoelectric conversion device using the thermoelectric material of the thermocouple.

The characteristics necessary for the thermocouple include generation of a voltage proportional to the temperature, a wide temperature measurement range, high durability, and the like, and low current is not a problem. Therefore, research and development to reduce the internal resistance of the thermocouple, which is a cause of the low current, has not been performed until now.

Under the above-mentioned situation, in order to widely spread thermoelectric generation that is environmentally friendly as a measure against global warming, there is a need for a versatile technology that makes it possible to perform thermoelectric generation using not a toxic material such as $Bi_2Te_3$ but a safe and inexpensive thermoelectric material.

CITATION LIST

Patent Literature

Patent Literature 1: Japanese Patent Application Laid-open No. 2013-016685
Patent Literature 2: Japanese Patent Application Laid-open No. 2016-63075

Non-Patent Literature

Non-Patent Literature 1: Hakko Electric Co., Ltd. Heat laboratory—3, 2004 Nov., Internet <URL: http://www.hakko.co.jp>

DISCLOSURE OF INVENTION

Technical Problem

In the case where thermocouples to be used for general temperature measurement are connected in series, the internal resistance increases while the voltage increases. Therefore, the thermoelectric material of the thermocouple could not be used for thermoelectric generation. In order to solve the problem, the device structure is reviewed retroactively to the principle of thermoelectric generation to develop a thermoelectric conversion device using a safe thermoelectric material such as one used in the thermocouple.

Solution to Problem

[1] A thermoelectric generation cell according to the present invention is a thermoelectric generation cell using thermoelectric generation by a Seebeck effect of a metal material, as a structure that utilizes excellences of electric conductivity and thermal conductivity in the metal material, and comprises a temperature difference holding section that maintains a temperature difference between a high temperature portion and a lower temperature portion of the metal material; and a member of the metal material that has a structure for minimizing an internal resistance indicating a relationship between a voltage and a current in the thermoelectric generation cell.

Further, the present inventors have conceived of a structure in which a part of "material characteristics that are in a trade-off relationship with low thermal conductivity and large electrical conductivity necessary for the thermoelectric material" is substituted by achieving, instead of the device structure in which only the thermoelectric material is responsible for functions necessary for thermoelectric generation, a device structure in which the functions are separated into components constituting the thermoelectric generation device so that "electricity is hard to flow in the heat flow direction and heat is difficult to flow in the electricity flow direction", as a means to solve the cause of the difficulty of thermoelectric generation that uses a thermoelectric material of a thermocouple.

That is, as the following thermoelectric generation cells of [2] to [6], the following creativity and originality in which the apparent thermal conductivity is reduced as a whole by composition stacking of an insulation film having low thermal conductivity and a metal thin plate and the apparent electrical conductivity is increased as a whole by bypassing and connecting the composition stacked body using a thin line or an extended conductor portion of metal have been made.

[2] A thermoelectric generation cell according to the present invention is, for example, as shown in Parts (A) and (b) of FIG. 1, comprises a plurality of stacked bodies formed by stacking a plurality of thermoelectric generation units; a heat collection plate (8) provided on a side of a heating section (11) of the plurality of stacked bodies; and a heat sink (9) provided on a side of a heat radiation section of the plurality of stacked bodies. The thermoelectric generation units each include a first thin metal plate (1), a second thin metal plate (2) joined to the first thin metal plate, an insulation film (3) overlapped on an opposing surface of the second thin metal plate, the opposing surface being opposed to a joining surface (6) between the first and second thin metal plates, a first wire (4) connected to the first thin metal plate, the first fire being formed of a same material as a material of the first thin metal plate, a second wire (5) connected to the second thin metal plate, the second wire being formed of a same material as a material of the second thin metal plate, and a cold contact point (7) at which end portions of the first and second wires are connected, the end portions are different ends opposite to end portions connected to the first and second thin metal plates.

In the thermoelectric generation cell according to the present invention configured as described above, heat flow flows from the high temperature side to the low temperature side through the joining surface of the composite stacked layers, and current flows for each unit in the order of a thin metal plate (1), a wire (4), a cold contact, a wire (5), and a thin metal plate (2), and the heat flow and the current cross flow. Therefore, there is less interference between the heat flow and the current.

Further, regarding the wires (4) and (5), the cross-sectional area and the length of each of the wires (4) and (5) are appropriately selected so that they are caused to operate as temperature difference holding sections. In order to achieve a structure in which the internal resistance that represents the relationship between the voltage and the current in the power generation device is minimized, the apparent electrical conductivity is increased as a whole to minimize the internal resistance by selecting the cross-sectional area and the length of each of the wires 4 and 5 and bypassing and connecting the composite stacked layers using a thin line of metal as a structure in which the wires (4) and (5) are mechanically connected to the thin metal plates 1 and 2 and pulled out from the composite stacked layers.

[3] A thermoelectric generation cell according to the present invention is, for example, as shown in Part (A) and (B) of FIG. 8, comprises a plurality of stacked bodies formed by stacking a plurality of thermoelectric generation units; a heat collection plate (108) provided on a side of a heating section (111) of the plurality of stacked bodies; and a heat sink (109) provided on a side of a heat radiation section of the plurality of stacked bodies. The thermoelectric generation units each include a first thin metal plate (101), a second thin metal plate (102) joined to the first thin metal plate, an insulation film (103) overlapped on an opposing surface of the second thin metal plate, the opposing surface being opposed to a joining surface (106) between the first and second thin metal plates, a first extension conductor (104) connected to the thin metal plate, the first extension conductor being formed of a same material as a material of the thin metal plate, a second extension conductor (105) connected to the thin metal plate, the second extension conductor being formed of a same material as material of the thin metal plate, and a cold contact point (107) at which end portions of the first and second extension conductors are connected, the end portions being different ends opposed to end portions connected to the first and second thin metal plates.

In the thermoelectric generation cell according to the present invention configured as described above, the extended conductor portion is used in [3] instead of the second wire in [2]. The shape of the extended conductor portion is, for example, a band shape or a tape shape, and it is easier to take a large cross-sectional area as compared with the case of wire. It is also possible to cause the extended conductor part as the temperature difference holding section, and minimize the internal resistance by bypassing and connecting the composite stacked layers using the extended conductor portion of metal to increase the apparent electrical conductivity as a whole.

[4] In the thermoelectric generation cell according to the present invention, favorably, each cold contact of the thermoelectric generation cell may be cooled in units of several groups or collectively to inhibit a back thermal electromotive force at each cold contact from being generated.

[5] In the thermoelectric generation cell according to the present invention, favorably, as the insulation film of the thermoelectric generation cell, an insulation material that has plasticity and absorbs thermal displacement between stacked layers may be used in addition to insulate between stacks.

[6] In the thermoelectric generation cell according to the present invention, favorably, as the thin metal plate (1), a metal having an electric resistance of not more than 70 μΩ·cm and a thermal conductivity of not less than 60 W/m·K is used, and as the thin metal plate (2), a metal having an electric resistance of not more than 70 μΩ·cm and a thermal conductivity of not more than 40 W/m·K is used. The electrical resistivity of tellurium used as the thermoelectric material is 400 mΩ·cm and exceeds the upper limit value 70 μΩ·cm of the electrical resistivity in [6], and toxic tellurium is not used as a matter specifying the invention.

[7] In the thermoelectric generation cell according to the present invention, favorably, the first and second thin metal plates (101, 102) may have a structure in which the insulation layer is sandwiched inside fire-resistant-material frames (10, 110).

[8] A thermoelectric generation module according to the present invention is a thermoelectric generation module using a thermoelectric generation cell that includes the unit, in which a stacked direction of the thermoelectric generation cells is perpendicular to a heating surface. The heating surface may be flat surface or curved surface.

Further, the present inventors uses, as other aspects [9] to [16] to solve the cause of the difficulty of thermoelectric generation that uses a thermoelectric material of a thermocouple, a thermoelectric generation cell having a structure in which a heating section of a plurality of stacked bodies of thermoelectric generation units and a cooling insulation oil section provided on the side of a cooling section of the thermoelectric generation unit are provided as a basic structure. In the thermoelectric generation cell, the shape of the thermoelectric generation unit is devised as a temperature difference holding section that maintains the temperature difference of the high temperature portion and the low temperature portion, which occurs between the heating section and the cooling insulation oil section. Further, as a structure in which the internal resistance that represents the relationship between the voltage and the current in the power generation device is minimized, the shape of the metal conductor of the thermoelectric generation unit is devised.

[9] A thermoelectric generation cell according to the present invention is, for example, as shown in Parts (A) and (B) of FIG. 9, comprises a fire-resistant-material frame (210) that holds a plurality of stacked thermoelectric generation units in states that adjacent thermoelectric generation units are insulated with each other and stacked: a heating section (211) of a plurality of stacked bodies of the thermoelectric generation units, the heating section being provided in the fire-resistant-material frame; and a cooling insulation oil section (212) provided on a side of a cooling section of the thermoelectric generation units, wherein each of the thermoelectric generation units is bridged between the fire-resistant-material frame and the cooling insulation oil section, the thermoelectric generation units each include a first band-shaped metal sheet (201) bridged between the fire-resistant-material frame and the cooling insulation oil section, a second band-shaped metal sheet (202) bridged between the fire-resistant-material frame and the cooling insulation oil section, the second band-shaped metal sheet being joined to the first band-shaped metal sheet in the fire-resistant-material frame, an insulation layer (203) located on an opposite side of a joining surface (206) between the first and second band-shaped metal sheets and formed on an opposite surface to the joining surface between the first and second band-shaped metal sheets, and a cold contact point (207) located at end portions opposed to the joining surface of the first and second band-shaped metal sheets, the cold contact point being cooled by the cooling insulation oil section.

[10] In the thermoelectric generation cell according to the present invention, favorably, the first band-shaped metal sheet may include a first extension conductor (204) located between the fire-resistant-material frame and the cooling insulation oil section, and the second band-shaped metal sheet may include a second extension conductor (205) located between the fire-resistant-material frame and the cooling insulation oil section.

[11] In the thermoelectric generation cell according to the present invention, favorably, the joining surface (206) between the first and second band-shaped metal sheets may be joined by diffusion bonding or laser beam welding.

[12] In the thermoelectric generation cell according to the present invention, favorably, the joining surface (206) between the first and second band-shaped metal sheets may have a structure that the insulation layer is sandwiched and bent inside the fire-resistant-material frame (210).

[13] A thermoelectric generation cell according to the present invention is, for example, as shown in Parts (A) and (B) of FIG. 10, comprises a fire-resistant-material frame (310) that holds a plurality of thermoelectric generation units in states that adjacent thermoelectric generation units are insulated with each other and separated; a heating section (311) of a plurality of stacked bodies of the thermoelectric generation units, the heating section being provided in the fire-resistant-material frame; and first and second cooling insulation oil sections (312*a* and 312*b*) that are provided at both sides of the fire-resistant-material frame and provided on sides of first and second cooling sections of the thermoelectric generation units. Each of the thermoelectric generation units is bridged between the first cooling insulation oil section, the fire-resistant-material frame, and the second cooling insulation oil section in an extended state.

[14] In the thermoelectric generation cell according to the present invention, favorably,
the thermoelectric generation units each may include a first band-shaped metal sheet (301) bridged between the first cooling insulation oil section and the a fire-resistant-material frame, a second band-shaped metal sheet (302) bridged between the fire-resistant-material frame and the second cooling insulation oil section, and joined to the first band-shaped metal sheet in the fire-resistant-material frame, an insulation layer (303) located on an opposite side of a joining surface (306) between the first and second band-shaped metal sheets and formed on an opposite surface to the joining surface between the first and second band-shaped metal sheets, a first cold contact (307*a*) located at end portions opposed to the joining surface of the first and second band-shaped metal sheets, the first cold contact being cooled by the first cooling insulation oil section, and a second cold contact (307*b*) located at end portions opposed to the joining surface of the first and second band-shaped metal sheets, the second cold contact being cooled by the second cooling insulation oil section.

[15] In the thermoelectric generation cell according to the present invention, favorably, the first band-shaped metal sheet may include a first extension conductor (304) located between the first cooling insulation oil section and the fire-resistant-material frame, and the second band-shaped metal sheet includes a second extension conductor (305)

located between the fire-resistant-material frame and the second cooling insulation oil section.

[16] The thermoelectric generation units according to [14] the thermoelectric generation units each according to claim 13 further may include a third band-shaped metal sheet (321) bridged between the second cooling insulation oil section and the a fire-resistant-material frame, a fourth band-shaped metal sheet (322) bridged between the fire-resistant-material frame and the first cooling insulation oil section, the fourth band-shaped metal sheet being joined to the third band-shaped metal sheet in the fire-resistant-material frame, and a second insulation layer (323) located on an opposite side of a joining surface (326) between the third and fourth band-shaped metal sheets and formed on an opposite surface to the joining surface. The second cold contact (307b) is cooled by the second cooling insulation oil section, the second cold contact has a structure that an end portion of the second band-shaped metal sheet on a side of the cold contact and an end portion of the third band-shaped metal sheet on a side of the cold contact are joined, and the first cold contact (307a) is cooled by the first cooling insulation oil section, the first cold contact has a structure that an end portion of the fourth band-shaped metal sheet on a side of the cold contact and an end portion of the first band-shaped metal sheet on a side of the cold contact are joined.

[17] the third band-shaped metal sheet may include a third extension conductor (324) located between the second cooling insulation oil section and the fire-resistant-material frame, and the fourth band-shaped metal sheet includes a fourth extension conductor (325) located between the fire-resistant-material frame and the first cooling insulation oil section.

Advantageous Effects of Invention

The present invention has the effect of substituting a part of material characteristics necessary for thermoelectric generation with a function of the device structure to make it possible to achieve thermoelectric generation using a safe and inexpensive thermoelectric material.

BRIEF DESCRIPTION OF DRAWINGS

FIGS. 4A and 4B are comparison diagrams of power generation characteristics between the existing thermocouple and Example 1, and shows the case of a temperature difference: 120° C.

FIG. 5 is a diagram showing temperature characteristics of no-load voltage in Example 1.

MODE(S) FOR CARRYING OUT THE INVENTION

Definition of Technical Terms in Present Specification

A thin metal plate is a thin plate that is formed of a material shown in Table 1 and has a thickness of 0.1 to 3 mm and a size of 5 to 100 mm square. The reason for the limitation of the numerical value is that joining processing is difficult if the thickness is not more than 0.1 mm and an effective thermal current cannot be achieved because the number of stacked layers is reduced if the thickness is not less than 3 mm. If the size is not more than 5 mm square, the joining area is small and an effective thermal current cannot be achieved. If the size is not less than 100 mm square, the thermal deformation increases and the durability is reduced.

A wire is a thin line that is formed of a material shown in Table 1 and has a diameter of 0.1 to 3 mm and a length of 50 to 200 mm. The reason for the limitation of the numerical value is that the electrical resistance is excessive if the diameter is not more than 0.1 mm, and the thermal conduction is excessive and an effective thermal current cannot be achieved if the diameter is not less than 3 mm.

An insulation film is a film that is formed of an inorganic material such as magnesia, zirconia, and alumina and includes a heat resistant adhesive having plasticity to absorb thermal displacement between stacked layers in addition to insulation of approximately 3 kV/mm.

An extended conductor portion is a band-shaped metal tape that is formed of a material shown in Table 1 and has a thickness of 0.1 to 3 mm, a length of 50 to 200 mm, and a width of 2 to 30 mm.

As connection, those capable of ensuring electrical connection and mechanical connection at a high temperature of, for example, approximately 1000° C. are favorable. For example, it is favorable to use laser beam welding.

As joining, those capable of ensuring electrical connection and mechanical connection at a cold contact of, for example, approximately 0 to 50° C. are favorable. For example, it is favorable to use brazing or soldering.

The thermoelectric generation cell according to this embodiment is a thermoelectric generation cell using thermoelectric generation by the Seebeck effect of a metal material. This thermoelectric generation cell includes, as a structure that makes use of the excellent conductivity and thermal conductivity of the metal material, a temperature difference holding section that maintains a temperature difference between a high temperature portion and a lower temperature portion of the metal material, and a member of the metal material having a structure for minimizing the internal resistance that represents a relationship between a voltage and a current in the thermoelectric generation cell.

The device structure of the thermoelectric generation cell according to the present invention will be described with reference to the drawings. In this embodiment, the same names are used for members having the same action, and overlapping description will be omitted in some cases.

Figure 1:
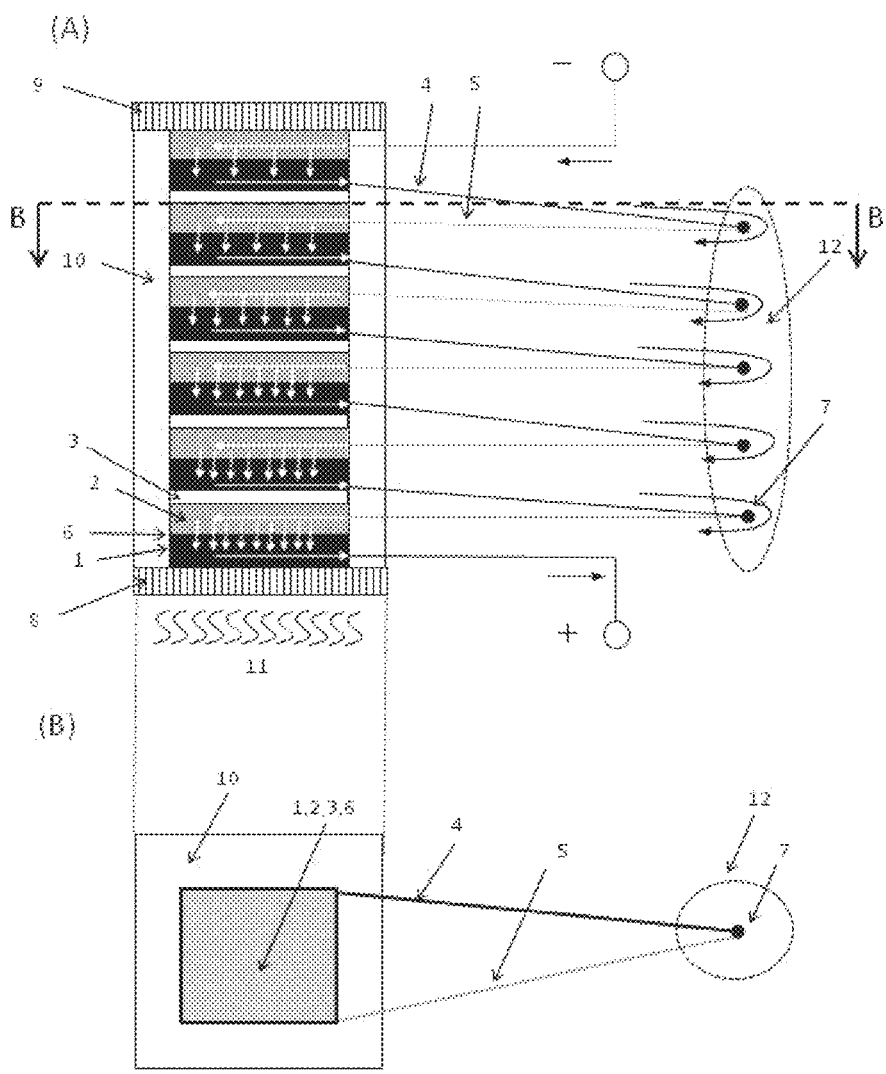
FIG. 1 is a structural view of a composite stacked thermoelectric generation cell showing an Example of the present invention, Part (A) of FIG. 1 is a cross-sectional view, and Part (B) of FIG. 1 is a plan view of the Part (A) in the B-B direction.

In Parts (A) and (B) of FIG. 1, the thermoelectric generation cell according to this embodiment includes a plurality of stacked bodies obtained by stacking a plurality of thermoelectric generation units, a heat collection plate 8 provided on the side of a heating section 11 of the plurality of stacked bodies, and a heat sink 9 provided on the side of a heat radiation section of the plurality of stacked bodies. A fire-resistant-material frame 10 is a cylindrical frame that covers the peripheral surface of the plurality of stacked bodies in the case where the bottom surface of the plurality of stacked bodies is covered by the heat collection plate 8 and the top surface of the plurality of stacked bodies is covered by the heat sink 9, and may include a slit or an opening window for drawing out a first wire 4 and a second wire 5. In the plurality of stacked bodies covered by the fire-resistant-material frame 10, a plurality of stacked bodies including a first thin metal plate 1, a second thin metal plate 2, and an insulation film 3 are stacked.

For the heat collection plate 8 and the heat sink 9, an appropriate metal material can be used as long as it is a metal plate material having appropriate strength as a structural material, and various materials such as a magnesium alloy plate, a stainless steel plate, a copper plate, and a steel plate in addition to an aluminum plate can be used. Further, in order to ensure the electrical insulation with the first thin metal plate 1 and the second thin metal plate 2 to be in contact with the heat collection plate 8 and the heat sink 9, an insulation material may be attached to the heat collection plate 8 and the heat sink 9 or surface treatment by which insulation can be ensured may be performed thereon. The fire-resistant-material frame 10 is formed of, for example, fire resistant cement or fire resistant ceramic.

The thermoelectric generation units each include the first thin metal plate 1, the second thin metal plate 2, the insulation film 3, the first wire 4, the second wire 5, a joining surface 6, and a cold contact 7.

Here, the first thin metal plate 1 may favorably include a metal plate formed of a material of, for example, Cu, Al, Ni, Fe, or Sn. As shown in Table 1 described below, a metal having an electric resistance of not more than 70 $\mu\Omega\cdot$cm and thermal conductivity of not less than 60 W/m·K is favorable. The second thin metal plate 2 is joined to the first thin metal plate 1, and favorably includes a metal plate formed of a material of, for example, alumel, Ti, constantan, or chromel. As shown in Table 1 described below, a metal having an electric resistance of not more than 70 $\mu\Omega\cdot$cm and thermal conductivity of not more than 40 W/m·K is favorable. Here, alumel has a composition of 94 wt % of nickel (Ni), 2.5 wt % of manganese (Mn), 2 wt % of aluminum (Al), 1 wt % of silicon (Si), and 0.5 wt % of iron (Fe). Chromel has a composition of 89 wt % of nickel (Ni), 9.8 wt % of chromium (Cr), 1 wt % of iron (Fe), and 0.2 wt % of manganese (Mn). Constantan has a composition of 55 wt % of copper (Cu) and 45 wt % of nickel (Ni).

The insulation film 3 is disposed on the opposing surface of the second thin metal plate 2 in a state of being superimposed. The opposing surface of the second thin metal plate 2 is a surface opposed to the joining surface 6 between the first and second thin metal plates.

The first wire 4 is connected to the thin metal plate 1 and formed of the same material as the thin metal plate 1. The second wire 5 is connected to the thin metal plate 2 and formed of the same material as the thin metal plate 2. As this joining, those capable of ensuring electrical connection and mechanical connection can be ensured even at a high temperature of, for example, approximately 1000° C. are favorable. For example, laser beam welding may be used.

As described above, the joining surface 6 is a joining surface between the first and second thin metal plates. The cold contact 7 joins end portions that are different ends of the first and second wires. Here, the end portions that are different ends of the first and second wires are end portions of the first and second wires opposite to end portions connected to the first and second thin metal plates.

A cooling section 12 cools the cold contact 7 provided in each of the thermoelectric generation units in units of several groups or collectively.

Now, the operation of the apparatus configured as described above will be described.

The heat received by the heat collection plate 8 shown in Part (A) of FIG. 1 generates a thermoelectromotive force at the joining surface 6 obtained by diffusion joining of the thin metal plate 1 and the thin metal plate 2, penetrates through the insulation film 3 to be transmitted to the upper layer, and is dissipated from the heat sink 9 to the atmosphere in the form of heat flow while repeatedly generating a thermoelectromotive force. Meanwhile, the thermal current generated at the joining surface 6 is temporarily out of the stacked layer by the first wire 4, passes through the cold contact 7 in the cooling section (12), and returns to the next stacked layer by the second wire 5. The above-mentioned mechanism is repeated by the same number as the number of stacked layers, and the increased thermal current flows from the positive electrode to the external load circuit.

Figure 3:
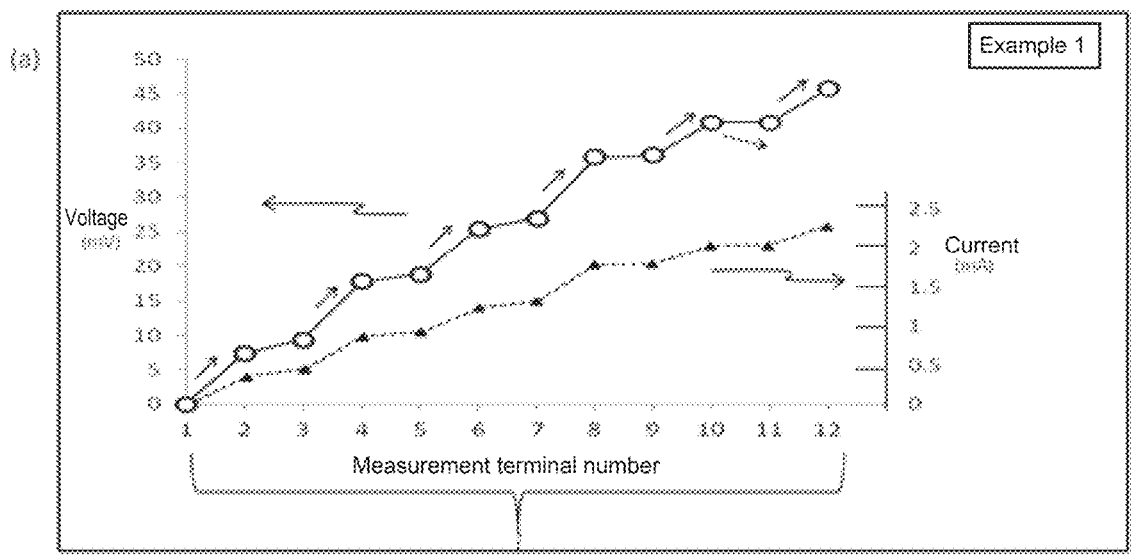
FIG. 3 is a diagram describing the distribution state of a voltage and a current inside the thermoelectric generation cell showing the Example of the present invention, Part (A) of FIG. 3 shows a voltage integrated value for each measurement terminal number, and Part (B) of FIG. 3 is a structural view of the composite stacked thermoelectric generation cell to be measured.
Figure 3:
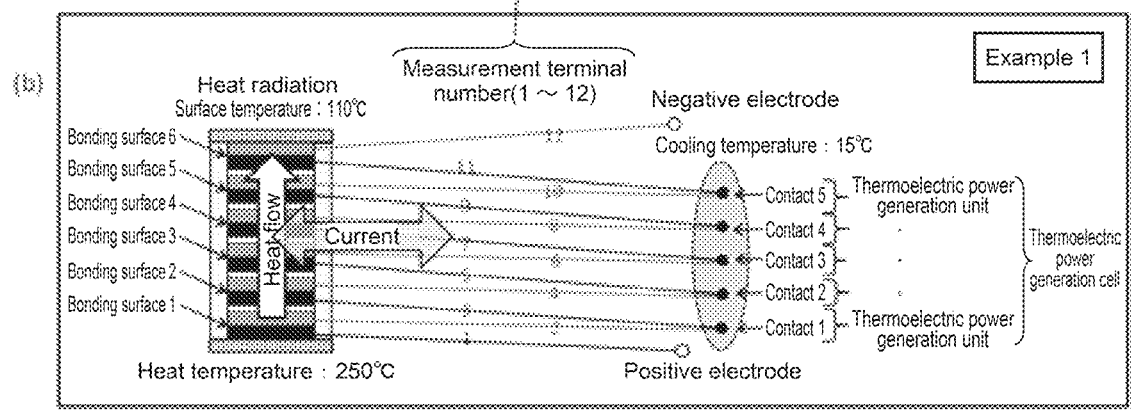

In order to specifically show the features of the present invention, the situation in which an electromotive force is generated inside the thermoelectric generation cell is summarized in Parts (a) and (b) of FIG. 3. As shown in Part (a) of FIG. 3, the voltage and current between the positive electrode of the thermoelectric generation cell and the measurement terminal of each unit gradually increase for every even numbered measurement terminal number. That is, a thermoelectromotive force is generated at the joining surface 6 and is not generated at the cold contact 7.

Regarding the minute changes in the voltage and current shown in Part (a) of FIG. 3, the voltage and current are slightly reduced at the measurement terminal number 11, and a slight back electromotive force is generated in this portion. However, a back electromotive force is not generated at other measurement terminal number.

As described above, design guidelines in which the voltage and current uniformly increase in proportion to the number of connections between the joining surface and the cold contact by uniformly cooling each cold contact and the electromotive force of the thermoelectric generation cell is proportional to the number of stacked layers of units can be obtained.

Figure 2:
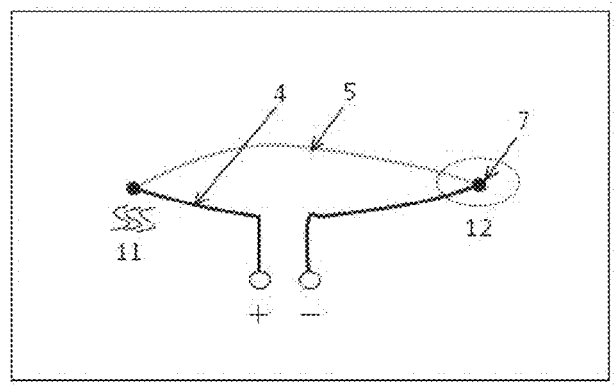
FIG. 2 is a main part configuration diagram describing a structure of an existing thermocouple.

The features of the present invention will be specifically described below. In the case where two types of thin metal plates having different thermal conductivities are joined and an insulation film is superimposed thereon to achieve composite stacked layers, for example, the joining area of the thin metal plate having a size of 12 mm square is larger than that of the thermocouple having a diameter of 0.3 mm shown in FIG. 2 by three digits or more.

The wire connected to the above-mentioned thin metal plate having the composite stacked layers has a diameter and length where the heat of the composition stacked body is difficult to transmit, e.g., a diameter of 0.3 mm and a length of 70 mm, and a different end of the wire is joined to form a cold contact.

In principle, in the case where two types of metals are joined and a plurality of joining portions are connected in series, the order of the two types of metals is reversed at every other joining portion, and a reverse electromotive force is generated in the reverse joining portion to reduce the overall electromotive force. However, by making the temperature difference at the joining portion zero, the electromotive force becomes zero at the joining portion. In this embodiment, by cooling the cold contact where the joining of the two types of metals is reversed, a reverse electromotive force is made substantially zero.

A combination of the composite stacked layer and the cold contact of the wire is used as a unit, and a plurality of units are stacked to form a thermoelectric generation cell. The joining area of the thermoelectric generation cell is larger than that of the thermocouple having a diameter of 0.3 mm shown in FIG. 2 by five digits or more. The heat given to the thermoelectric generation cell repeatedly penetrates the joining surface and is used for thermoelectric generation, the heat dissipated from the upper surface of the thermoelectric generation cell is reduced, and the electromotive force increases.

In the case where the bottom surface of the thermoelectric generation cell is heated and each cold contact of the wire is cooled, the heat flow penetrates the composite stacked layers to flow to the lower temperature side, and is dissipated from the upper surface of the thermoelectric generation cell. Meanwhile, the generated thermal current increases by repeating bypassing in which it passes each cold contact of the wire and returns to the composite stacked layers.

The device structure of the thermoelectric generation cell will be described below in more detail. An insulation film is superimposed on the joining body obtained by joining the two types of thin metal plates 1 and 2 to achieve a stacked structure of the thin metal plate 1/the thin metal plate 2/the insulation film, the wires 4 and 5 formed of the same material as the thin metal plates 1 and 2 are connected to the thin metal plates 1 and 2 and drawn out in the lateral direction of the stacked structure, and the ends of the wires 4 and 5 are joined to form a cold contact, thereby forming a unit.

A plurality of units are stacked to form a thermoelectric generation cell having the composite stacked layers in which the thin metal plate 1/the thin metal plate 2/the insulation film 3/the thin metal plate 1/the thin metal plate 2/the insulation film 3 are repeated. The heat flow of the thermoelectric generation cell penetrates the joining surface of the composite stacked layers to flow from the high temperature side to the low temperature side, and the generated current flows through the bypass path of the electrically connected wire in which a joining surface-a cold contact-a joining surface-a cold contact are repeated.

As a result of the above, the heat flow flows through the composite stacked layers but the current is cut off, and the current flows through the bypass path but the heat flow hardly flows. That is, the heat flow and current cross flow, and the interference between the heat flow and current is eliminated, and a stable thermoelectromotive force can be obtained.

The wire is connected to reduce the heat flow between the joining surface having a high temperature and the cooled cold contact. The material of the wire is the same as those of the thin metal plates 1 and 2, and the diameter of the wire is, for example, approximately 0.3 mm so that the internal resistance does not increase. The length of the wire is set to approximately 70 mm to make it hard for the heat of the thin metal plates 1 and 2 to be transmitted to the cold contact.

As a Comparative Example, regarding power generation characteristics (temperature difference of 120° C.) of the thermocouple of copper/constantan having a diameter of 0.3 mm and a length of 10 cm, which is the technical root of the present invention, no-load voltage was 3.7 mV, the internal resistance was 3.1Ω, and the maximum output was only 1 µW as shown in Part (a) of FIG. 4A.

Example 1

Copper and constantan each having a size of 12 mm square and a thickness of 0.3 mm were joined at a joining temperature: approximately 840° C., a heating temperature: 30 minutes, a pressure: approximately 1.7 MPa, and a joining atmosphere: approximately $1.8 \times 10^{-3}$ Pa. Here, the copper having a size of 12 mm square and a thickness of 0.3 mm corresponds to the first thin metal plate 1. Further, the constantan having a size of 12 mm square and a thickness of 0.3 mm corresponds to the second thin metal plate 2. The joining portion of copper and constantan corresponds to the joining surface 6 between the first and second thin metal plates.

Six thin plates of the joined copper/constantan having a size of 12 mm square are stacked with an insulation film sandwiched between thin plates as shown in Part (A) of FIG. 1.

As a result, in Example 1, as shown in FIG. 4B, the no-load voltage was 45.9 mV, the internal resistance was 2.95Ω, and the voltage increased by 12 times (from 3.7 to 45.9 mV), the internal resistance was unchanged (3.1≈2.95Ω), and the maximum output increased from 1 µW to 176 µW as compared to the above-mentioned Comparative Example, which demonstrated the effects of the present invention. Note that in FIG. 5, the temperature characteristics of the no-load voltage in Example 1 were shown. The no-charge voltage increases in a quadratic curve with the increase in temperature difference, and shows a different aspect from the semiconductor material in which a thermoelectromotive force is reduced at a high temperature. That is, the result of FIG. 5 shows that the characteristics of a metal thermoelectric material are excellent because a thermoelectromotive force increases as the temperature rises.

In Example 1, as shown in Part (b) of FIG. 3, in the case where the bottom surface of the thermoelectric generation cell was heated to 250° C., it was found that the temperature of the upper surface of the thermoelectric generation cell was high, i.e., 110° C. and the amount of unused heat was large.

Example 2

Therefore, in Example 2, the number of stacked layers is increased from six in Example 1 to 50, and the temperature of the upper surface is lowered to temperature close to room temperature. Further, as a scale-up, a joining surface is expanded from 12 mm square to 50 mm square and 300 thermoelectric generation cells are arranged in a plane (15×20) to achieve a thermoelectric generation module having a power generation capacity equivalent to solar power generation of 1.2 kW/m$^2$.

Figure 6:
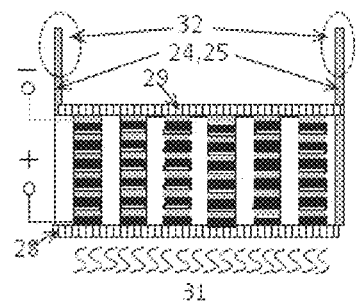
FIG. 6 is a cross-sectional view of a main part of a thermoelectric generation module in which a plurality of stacked thermoelectric generation cells showing another Example of the present invention are arranged in a plane.

In FIG. 6, a thermoelectric generation module in which six thermoelectric generation cells are arranged in a plane is illustrated.

In the figure, the thermoelectric generation cell according to this embodiment includes a plurality of stacked bodies obtained by staking a plurality of thermoelectric generation units, a heat collection plate 28 provided on the side of a heating section 31 of the plurality of stacked bodies, and a heat sink 29 provided on the side of a heat radiation section of the plurality of stacked bodies. A cold contact is thermally connected to a cooling section 32.

The thermoelectric generation units each include a first wire (24) and a second wire (25) in addition to a first thin metal plate, a second thin metal plate, an insulation film, a joining surface, and a cold contact as in the thermoelectric generation unit shown in Part (A) of FIG. 1.

Example 3

Figure 7:
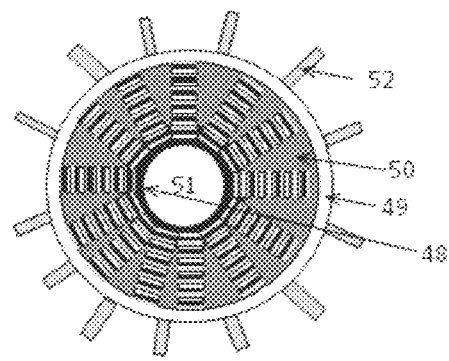
FIG. 7 is a cross-sectional view of a main part of a thermoelectric generation module in which a plurality of stacked thermoelectric generation cells showing another Example of the present invention are arranged in a tube shape.

Example 3 of the thermoelectric generation module having a pipe structure in which thermoelectric generation cells are arranged in a tube shape as a heating/cooling system of the thermoelectric generation module is shown in FIG. 7.

In the figure, in the thermoelectric generation cell according to this embodiment, a plurality of stacked bodies each obtained by stacking a plurality of thermoelectric generation units are radially arranged. A high temperature gas or high temperature fluid such as a combustion exhaust gas flows in the tube-shaped central cavity. In this regard, a heat collection plate 48 is provided on the side of a heating section 51 of the plurality of stacked bodies. On the tube-shaped cylindrical outer edge portion, a heat sink 49 is provided on the side of a heat radiation section of the plurality of stacked bodies. A cooling section 52 is provided as a radiation fin on, for example, the heat sink 49, and it is favorable that a cold contact is thermally connected thereto.

A fire-resistant-material frame 50 is a substantially triangular prism-shaped frame to be provided in a wedge-shaped gap of the plurality of stacked bodies radially arranged. The substantially triangular prism-shaped tip is in contact with the heat collection plate 48 located on the side of the tube-shaped central cavity. The substantially triangular prism-shaped bottom is in contact with the heat sink 49 located on the side of the tube-shaped cylindrical outer edge. On each of the stacked bodies separated by the fire-resistant-material frame 50, a first thin metal plate, a second thin metal plate, and an insulation film are stacked.

In the apparatus configured as described above, warm water is caused to flow through the pipe and operate as the side of the heating section 51 of the plurality of stacked bodies via the heat collection plate 48. Further, by bringing the pipe into contact with, for example, a refrigerant such as cold water, the heat sink 49 on the surface of the pipe and the cooling section 52 exposed to the surface of the pipe are cooled. Further, even if the heating surface is a curved surface other than a cylinder, by stacking the thermoelectric generation cells in the direction perpendicular to the heating surface and filling and fixing them with a fire-resistant-material frame, it is possible to achieve a thermoelectric generation module having the heating surface with an arbitrary curved shape.

Example 4

Instead of the second wire according to Example 1, an extended conductor portion is used in this embodiment. The shape of the extended conductor portion is, for example, a band shape or a tape shape, and it is easier to take a large cross-sectional area as compared with the case of wire. It is also possible to cause the extended conductor portion as the temperature difference holding section, and minimize the internal resistance by bypassing and connecting the composite stacked layers using the extended conductor portion of metal to increase the apparent electrical conductivity as a whole.

Figure 8:
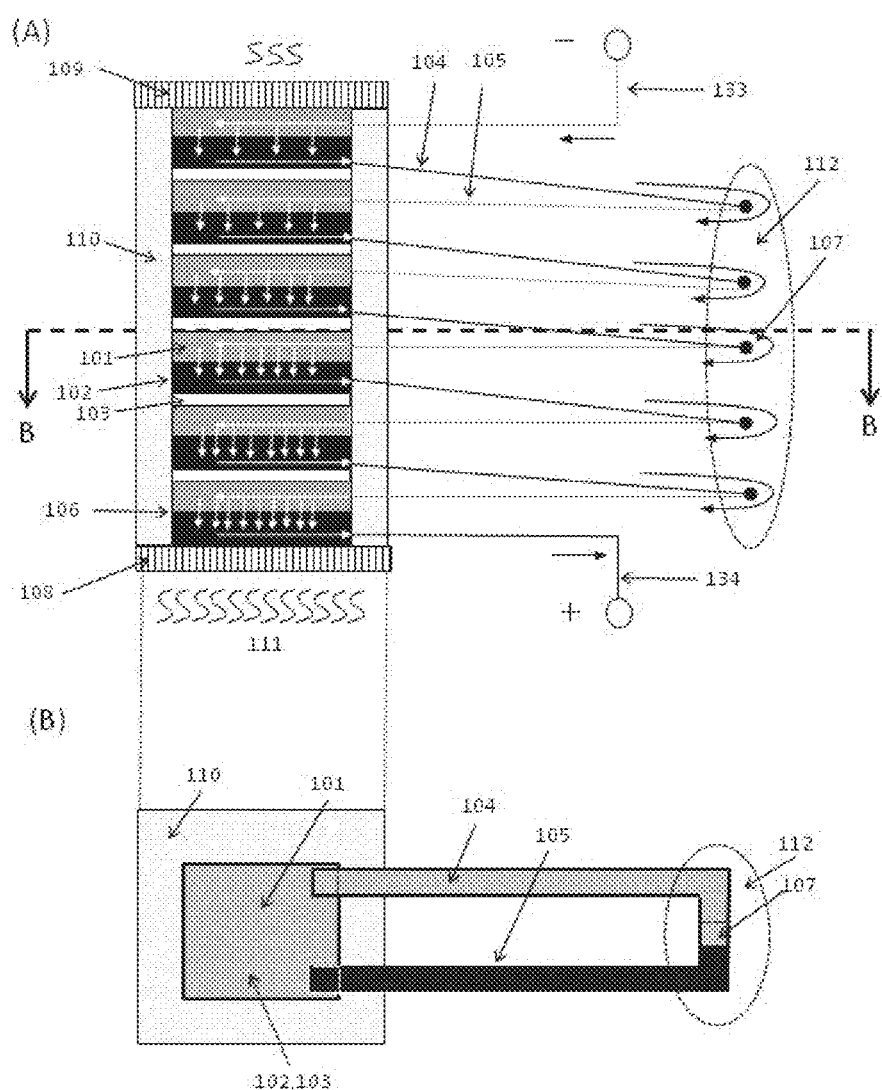
FIG. 8 is a structural view of the composite stacked thermoelectric generation cell showing another Example of the present invention, Part (A) of FIG. 8 is a cross-sectional view, and Part (B) of FIG. 8 is a plan view of the Part (A) in the B-B direction.

FIG. 8 is a structural view of the composite stacked thermoelectric generation cell showing Example 4, Part (A) of FIG. 8 is a cross-sectional view, and Part (B) of FIG. 8 is a plan view of the Part (A) in the B-B direction. Note that in Parts (A) and (B) of FIG. 8, those that perform the same action as those in Parts (A) and (B) of FIG. 1 are given the corresponding names, the description is applied, and detailed description is omitted.

In the figure, a thermoelectric generation cell according to this embodiment includes a plurality of stacked bodies obtained by stacking a plurality of thermoelectric generation units, a heat collection plate 108 provided on the side of a heating section 111 of the plurality of stacked bodies, and a heat sink 109 provided on the side of a heat radiation section of the plurality of stacked bodies. In the plurality of stacked bodies, the thermoelectric generation units are electrically connected in series. Here, the thermoelectric generation unit on the side of the heat sink 109 is connected to a negative terminal 133 and the thermoelectric generation unit on the side of the heat collection plate 108 is connected to a positive terminal 134.

The thermoelectric generation units each include a first thin metal plate 101, a second thin metal plate 102 joined to the first thin metal plate, a joining surface 106, an insulation film 103, a first extension conductor 104, a second extension conductor 105, and a cold contact 107.

The insulation film 103 is formed by being superimposed on the opposing surface of the second thin metal plate 102 opposed to the joining surface 106 between the first and second thin metal plates. The first extension conductor 104 is a band-shaped thin metal plate that is connected to the first thin metal plate 101 and formed of the same material as that of the first thin metal plate 101. The second extension conductor 105 is a band-shaped thin metal plate that is connected to the second thin metal plate 102 and formed of the second thin metal plate 102. The cold contact 107 is a cold contact to which an end portion of each of the first and second extension conductors 104 and 105, which is a different end with respect to an end portion connected to each of the first and second thin metal plates 101 and 102, is joined.

Now, the operation of the apparatus configured as described above will be described.

The heat received by the heat collection plate 108 shown in Part (A) of FIG. 8 generates a thermoelectromotive force at the joining surface 106 obtained by diffusion joining of the thin metal plate 101 and the thin metal plate 102, penetrates the insulation film 103 to be transmitted to the upper layer, and is dissipated from the heat sink 109 to the atmosphere in the form of heat flow while repeatedly generating a thermoelectromotive force. Meanwhile, the thermal current generated at the joining surface 106 is temporarily out of the stacked layer by the first extension conductor 104, passes through the cold contact 107 in a cooling section 112, and returns to the next stacked layer by the second extension conductor 105. The above-mentioned thermoelectric generation mechanism is repeated by the same number as the number of stacked layers, and the increased thermal current flows to the positive terminal 134 and the external load circuit connected to the negative terminal 133.

In the above-mentioned composite stacked thermoelectric generation cells according to Examples 1 to 4, as the device structure in which electricity is hard to flow in the heat flow direction and heat is difficult to flow in the electricity flow direction, by separating the paths of the heat flow and current and causing the heat flow and current to cross flow, the interference between the heat flow and current is eliminated to stabilize the thermoelectromotive force.

However, in order to solve the problem of the present invention, it is sufficient to review the device structure retroactively to the principle of thermoelectric generation to develop a thermoelectric conversion device using a safe thermoelectric material such as one used in the thermocouple. Therefore, the present technology is not necessarily limited to the structure in which the passes of heat flow and current are separated and the heat flow and current are caused to cross flow as in the above-mentioned composite stacked thermoelectric generation cells according to Examples 1 to 4. The point is that the thermoelectric generation cell according to the present invention only needs to be a thermoelectric generation cell using thermoelectric generation by the Seebeck effect of a metal material, the thermoelectric generation cell including, as a structure that makes use of the excellent conductivity and thermal conductivity of the metal material, a temperature difference holding section that maintains a temperature difference between a high temperature portion and a lower temperature portion of the metal material, and a member of the metal material having a structure for minimizing the internal resistance that represents a relationship between a voltage and a current in the power generation device.

Example 5

Figure 9:
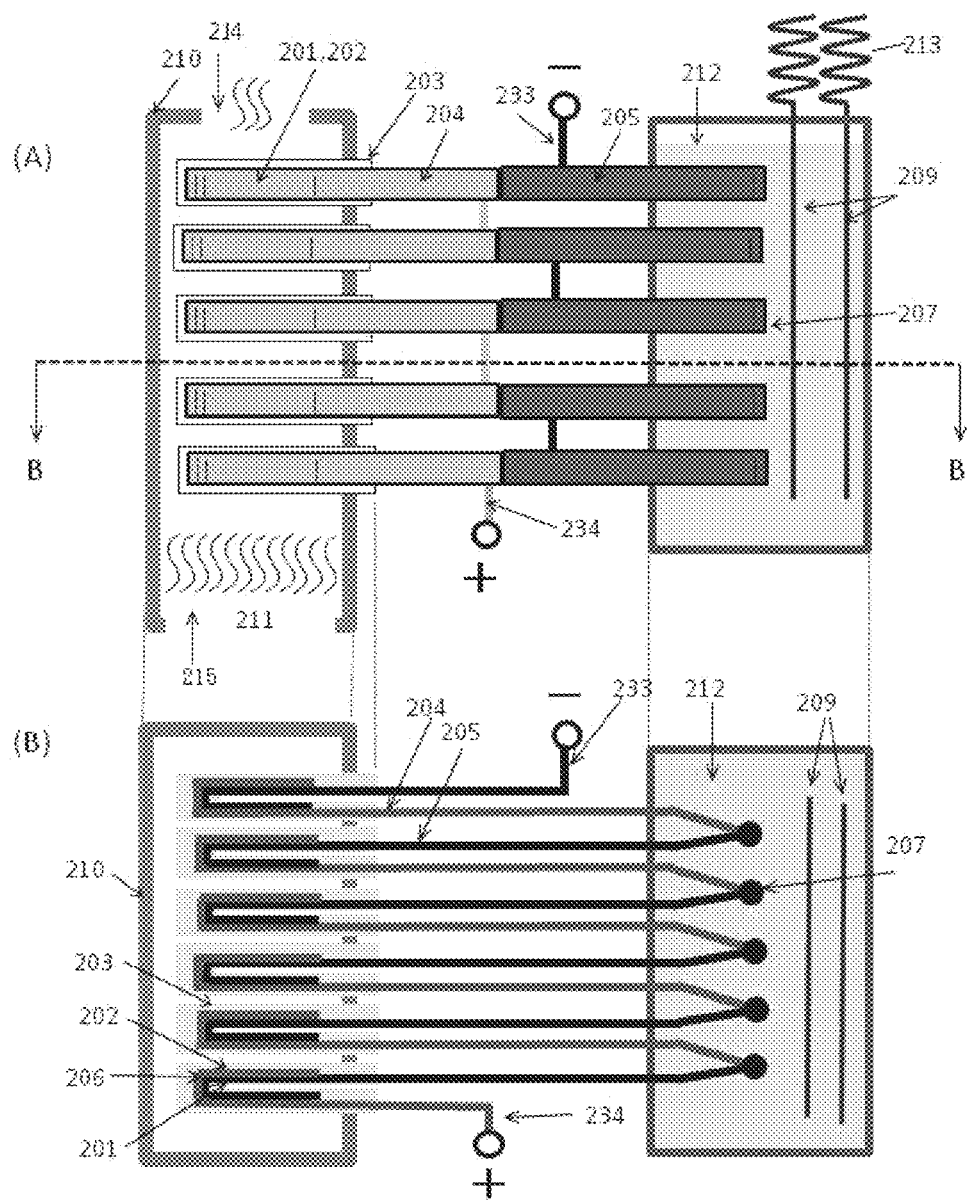
FIG. 9 is a structural view in which a plurality of thermoelectric generation cells each having a band shape are arranged as a heating/cooling system of a thermoelectric generation module showing another Example of the present invention, Part (A) of FIG. 9 is a cross-sectional view, and Part (B) of FIG. 9 is a plan view of the Part (A) in the B-B direction.

FIG. 9 is a structural view in which a plurality of thermoelectric generation cells each having a band shape are arranged as a heating/cooling system of a thermoelectric generation module showing Example 5 of the present invention, Part (A) of FIG. 9 is a cross-sectional view, and Part (B) of FIG. 9 is a plan view of the Part (A) in the B-B direction. Note that in Parts (A) and (B) of FIG. 9, those that perform the same action as those in Parts (A) and (B) of FIG. 1 and Parts (A) and (B) of FIG. 8 are given the corresponding names, the description is applied, and detailed description is omitted.

In the figure, a thermoelectric generation cell according to this embodiment includes a fire-resistant-material frame 210, a heating section 211 of a plurality of stacked bodies, and a cooling insulation oil section 212, and the thermoelectric generation units each have a structure of being bridged between the fire-resistant-material frame 210 and the cooling insulation oil section 212.

The fire-resistant-material frame 210 is used for stacking a plurality of thermoelectric generation units in the state of being insulated and separated from the adjacent thermoelectric generation units with each other, and ensures also electrical insulation by, for example, fire-resistant ceramic. The heating section 211 of the plurality of stacked bodies is a heating section of the plurality of stacked bodies of the thermoelectric generation units provided inside the fire-resistant-material frame 210, and is in contact with a high temperature gas such as a combustion gas. In the fire-resistant-material frame 210, an upper opening 214 and a lower opening 215 are provided, thereby achieving a structure in which the gas medium heated by the heating section 211 is blown off. The cooling insulation oil section 212 is provided on the side of the cooling section of the thermoelectric generation units. On the upper part of the cooling insulation oil section 212, a radiation fin 213 is provided. To the radiation fin 213, a heat sink 209 is connected. The heat sink 209 is located inside the cooling insulation oil section 212.

In the plurality of stacked bodies, the thermoelectric generation units are electrically connected in series. Here, the thermoelectric generation unit located on the uppermost side of the fire-resistant-material frame 210 is connected to a negative terminal 233, and the thermoelectric generation unit located on the lowermost side of the fire-resistant-material frame 210 is connected to a positive terminal 234.

The thermoelectric generation units each include a first band-shaped metal sheet 201, a second band-shaped metal sheet 202, an insulation layer 203, a first extension conductor 204, a second extension conductor 205, and a cold contact 207.

The first band-shaped metal sheet 201 has a portion located inside the fire-resistant-material frame 210 and a portion to be bridged between the fire-resistant-material frame 210 and the cooling insulation oil section 212, and a metal material similar to that of the thin metal plate is used therefor. The second band-shaped metal sheet 202 has a portion located inside the fire-resistant-material frame 210 and a portion to be bridged between the fire-resistant-material frame 210 and the cooling insulation oil section 212, and is joined to the first band-shaped metal sheet in the fire-resistant-material frame 210. The insulation layer 203 is located on an opposite side of a joining surface 206 between the first and second band-shaped metal sheets and formed on an opposite surface to the joining surface between the first and second band-shaped metal sheets. It is favorable that the insulation layer 203 has heat resistance because it is provided at a high temperature portion inside the fire-resistant-material frame 210 in some cases. The cold contact 207 has a structure in which it is located on an end portion opposed to the joining surface of the first and second band-shaped metal sheets and cooled by the cooling insulation oil section 212.

The first band-shaped metal sheet 201 favorably includes the first extension conductor 204 located between the fire-resistant-material frame 210 and the cooling insulation oil section 212, and the second band-shaped metal sheet 202 favorably includes the second extension conductor 205 located between the fire-resistant-material frame 210 and the cooling insulation oil section 212. The first extension conductor 204 and the second extension conductor 205 function as a temperature difference holding section that maintains the temperature difference between the fire-resistant-material frame 210 that is a high temperature portion and the cooling insulation oil section 212 that is a low temperature portion. Further, the first band-shaped metal sheet 201 and the second band-shaped metal sheet 202, and the first extension conductor 204 and the second extension conductor 205 function also as a structure for minimizing the internal resistance that represents the relationship between the voltage and current in the power generation device.

Now, the assembled state and operation of the apparatus configured as described above will be described.

First, regarding the assembled state of the apparatus, the central portions of the first and second band-shaped metal sheets 201 and 202 cut in a band shape are surface-joined to form a the joining surface 206. Next, the central portions of the first and second band-shaped metal sheets 201 and 202 including the joining surface 206 are bent to produce a unit of the thermoelectric generation cell. Next, a plurality of pairs (six pairs in Part (B) of FIG. 9) of units of the thermoelectric generation cell is fixed to the fire-resistant-material frame 210 and superimposed in a fire grate shape. In the cooling insulation oil section 212, the first extension conductor 204 of the first band-shaped metal sheet 201 is joined to an end of the second extension conductor 205 of the second band-shaped metal sheet 202 of the adjacent thermoelectric generation cell to form the cold contact 207.

Regarding the operation of the apparatus configured as described above, the heat supplied by the heating section 211 shown in Part (A) of FIG. 9 generates a thermoelectromotive force at the joining surface 206 obtained by diffusion joining of the first and second band-shaped metal sheets 201 and 202, blows through between the adjacent thermoelectric generation cells to be transmitted to the upper thermoelectric generation cell, and is dissipated from the cooling insulation oil section 212 to the atmosphere via the radiation fin 213 in the form of heat flow while repeatedly generating a thermoelectromotive force. Meanwhile, the thermal current generated at the joining surface 206 is temporarily out of the stacked layer by the first extension conductor 204, passes through the cold contact 207 in the cooling insulation oil section 212, and returns to the next stacked layer by the second extension conductor 205. The above-mentioned thermoelectric generation mechanism is repeated by the same number as the number of stacked layers, and the increased thermal current flows to the positive terminal 234 and the external load circuit connected to the negative terminal 233.

Example 6

Figure 10:
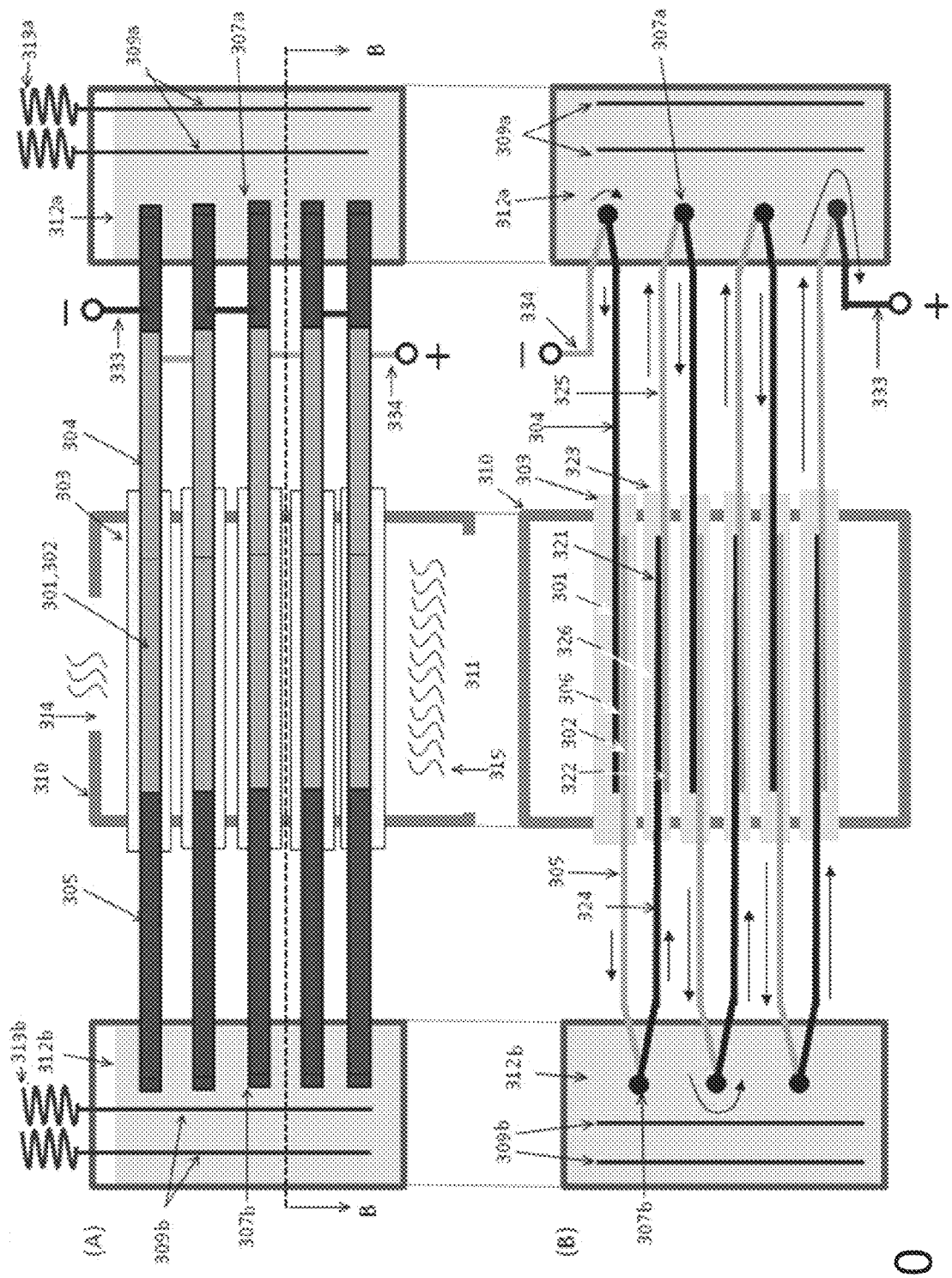
FIG. 10 is a structural view of a thermoelectric generation module showing another Example of the present invention, Part (A) of FIG. 10 is a cross-sectional view, and Part (B) of FIG. 10 is a plan view of the Part (A) in the B-B direction. It is suitable for the scale-up necessary for increasing the amount of power generation.

FIG. 10 is a structural view of a thermoelectric generation module showing Example 6 of the present invention, Part (A) of FIG. 10 is a cross-sectional view, and Part (B) of FIG. 10 is a plan view of the Part (A) in the B-B direction. Example 6 is suitable for the scale-up necessary for increasing the amount of power generation. Note that in Parts (A) and (B) of FIG. 10, those that perform the same action as those in Parts (A) and (B) of FIG. 1, Parts (A) and (B) of FIG. 8, and Parts (A) and (B) of FIG. 9 are given the corresponding names, the description is applied, and detailed description is omitted.

In the figure, a thermoelectric generation cell according to this embodiment includes a fire-resistant-material frame 310, a heating section 311 of a plurality of stacked bodies, and first and second cooling insulation oil sections 312a and 312b, and thermoelectric generation units are bridged between the first cooling insulation oil section 312a, the fire-resistant-material frame 310, and the second cooling insulation oil section 312b while being extended.

The fire-resistant-material frame 310 is used for stacking a plurality of thermoelectric generation units in the state of being insulated from the adjacent thermoelectric generation units with each other, and ensures also electrical insulation by, for example, fire-resistant ceramic. The heating section 311 of the plurality of stacked bodies is a heating section of the plurality of stacked bodies of the thermoelectric generation units provided inside the fire-resistant-material frame 310, and is in contact with a high temperature gas such as a combustion gas. In the fire-resistant-material frame 310, an upper opening 314 and a lower opening 315 are provided, thereby achieving a structure in which the gas medium heated by the heating section 311 is blown off. The first and second cooling insulation oil sections 312a and 312b are provided on both sides of the fire-resistant-material frame 310 at a predetermined interval, and provided on the sides of the first and second cooling sections of the thermoelectric generation units. On the upper portions of the cooling insulation oil sections 312a and 312b, respectively, radiation fins 313a and 313b are provided. To the radiation fins 313a and 313b, respectively, heat sinks 309a and 309b are connected. The heat sinks 309a and 309b are respectively located inside the cooling insulation oil sections 312a and 312b.

In the plurality of stacked bodies, the thermoelectric generation units are electrically connected in series. Here, the thermoelectric generation unit located on the uppermost side of the fire-resistant-material frame 310 is connected to a negative terminal 333, and the thermoelectric generation unit located on the lowermost side of the fire-resistant-material frame 310 is connected to a positive terminal 334.

The thermoelectric generation units each include a first band-shaped metal sheet 301, a second band-shaped metal sheet 302, an insulation layer 303, a joining surface 306, a first cold contact 307a, a second cold contact 307b, a third band-shaped metal sheet 321, a fourth band-shaped metal sheet 322, a joining surface 326, and a second insulation layer 323.

The first band-shaped metal sheet 301 has a portion located inside the fire-resistant-material frame 310 and a portion to be bridged between the first cooling insulation oil section 312a and the fire-resistant-material frame 310, and a metal material similar to that of the thin metal plate is used therefor. The second band-shaped metal sheet 302 has a portion located inside the fire-resistant-material frame 310 and a portion to be bridged between the fire-resistant-material frame 310 and the second cooling insulation oil section 312b, and is joined to the first band-shaped metal sheet 301 inside the fire-resistant-material frame 310. The insulation layer 303 is located on an opposite side of a joining surface 306 between the first and second band-shaped metal sheets and formed on an opposite surface to the joining surface between the first and second band-shaped metal sheets, and ensures electrical insulation. It is favorable that the insulation layer 303 has heat resistance because it is provided at a high temperature portion inside the fire-resistant-material frame 310 in some cases. The first cold contact 307a has a structure in which it is located on an end portion opposed to the joining surface of the first and second band-shaped metal sheets and cooled by the first cooling insulation oil section 312a. The second cold contact 307b has a structure in which it is located on an end portion opposed to the joining surface of the first and second band-shaped metal sheets and cooled by the second cooling insulation oil section 312b.

The third band-shaped metal sheet 321 has a portion located inside the fire-resistant-material frame 310 and a portion to be bridged between the second cooling insulation oil section 312b and the fire-resistant-material frame 310, and a metal material similar to that of the thin metal plate is used therefor. The fourth band-shaped metal sheet 322 has a portion located inside the fire-resistant-material frame 310 and a portion to be bridged between the fire-resistant-material frame 310 and the first cooling insulation oil section 312a, and is joined to the third band-shaped metal sheet inside the fire-resistant-material frame 310. The insulation layer 323 is located on an opposite side of a joining surface 326 between the third and fourth band-shaped metal sheets and formed on an opposite surface to the joining surface between the third and fourth band-shaped metal sheets.

The second cold contact 307b to be cooled by the second cooling insulation oil section 312b has a structure in which an end portion of the second band-shaped metal sheet on the side of the cold contact and an end portion of the third band-shaped metal sheet on the side of the cold contact are joined. The first cold contact 307a to be cooled by the first cooling insulation oil section 312a has a structure in which an end portion of the fourth band-shaped metal sheet on the side of the cold contact and an end portion of the first band-shaped metal sheet on the side of the cold contact are joined.

The first band-shaped metal sheet 301 includes a first extension conductor 304 located between the first cooling insulation oil section 312a and the fire-resistant-material frame 310. The second band-shaped metal sheet 302 includes a second extension conductor 305 located between the fire-resistant-material frame 310 and the second cooling insulation oil section 312b. The first extension conductor 304 and the second extension conductor 305 function as a temperature difference holding section that maintains the temperature difference between the fire-resistant-material frame 310 that is a high temperature portion and the cooling insulation oil sections 312a and 312b that are low temperature portions. Further, the first band-shaped metal sheet 301 and the second band-shaped metal sheet 302, and the first extension conductor 304 and the second extension conductor 305 function also as a structure for minimizing the internal resistance that represents the relationship between the voltage and current in the power generation device.

The third band-shaped metal sheet 321 includes a third extension conductor 324 located between the second cooling insulation oil section 312b and the fire-resistant-material frame 310. The fourth band-shaped metal sheet 322 includes a fourth extension conductor 325 located between the fire-resistant-material frame 310 and the first cooling insulation oil section 312a. The third extension conductor 324 and the fourth extension conductor 325 function as a temperature difference holding section that maintains the temperature difference between the fire-resistant-material frame 310 that is a high temperature portion and the cooling insulation oil section 312a and 312b that are low temperature portions. Further, the first band-shaped metal sheet 321 and the second band-shaped metal sheet 322, and the third extension conductor 324 and the fourth extension conductor 325 function also as a structure for minimizing the internal resistance that represents the relationship between the voltage and current in the power generation device.

Now, the operation of the apparatus configured as described above.

The operation of Example 6 is basically similar to the operation of Example 5. Further, in accordance with the structure of Example 6, by forming the joining surfaces 306 and 326 of the band-shaped thin metal plates in an elongated shape instead of bending them, thermal deformation is easily absorbed and durability increases. At the same time, two insulation oil baths as the cooling insulation oil sections 312a and 312b are achieved, and the cold contact gap spreads, thereby improving the cooling effect.

Note that although Examples of Cu/constantan has been shown as a thermoelectric material to be used for the thermoelectric generation cell in the above-mentioned embodiment, the thermoelectric material to be used in the present invention is not limited thereto. By combining a metal (Cu, Al, Ni, Fe, or Sn) having an electric resistance of not more than 70 μΩcm and thermal conductivity of not less than 60 W/m·K shown in Table 1 and a metal (alumel, Ti, constantan, or chromel) having an electric resistance of not more than 70 μΩ·cm and thermal conductivity of not more than 40 W/m·K, two types of metals whose thermal conductivities differs by two times or more, e.g., Al/Ti, Al/chromel, Al/constantan, Ni/Ti, Fe/constantan, or Sn/Ti can be joined and used.

TABLE 1

| Division | Metal material | Thermal conductivity · $\lambda$ (W/m · K) | Resistivity · $\rho$ (μΩ · cm) |
|---|---|---|---|
| (1) | Cu | 398 | 1.6 |
| $\lambda > 60$ | Al | 236 | 2.5 |
| W/m · K | Ni | 90 | 6.2 |
| | Fe | 84 | 8.9 |
| | Sn | 67 | 11 |
| (2) | Alumel | 32 | 33 |
| $\lambda < 40$ | Ti | 22 | 42 |
| W/m · K | Constantan (45% Ni · 55% Cu) | 20 | 50 |
| | Chromel | 19 | 70 |
| (Reference) | Bismuth | 8 | 129 |
| | Tellurium (toxic) | 2~3 | $4 \times 10^5$ |

Although the method of joining the thin metal plate, diffusion joining has been adopted in Examples, a vacuum deposition method, a plating method with surface treatment, and a rolling clad method can be used as long as it is resistant to thermal deformation and the thickness of the alloy layer formed at the joining interface is not more than 300 nm. For example, industrial production becomes possible by joining a thin metal plate having a large area by a rolling clad method and cutting it by laser processing or the like that does not damage the joining interface.

INDUSTRIAL APPLICABILITY

In accordance with the thermoelectric generation cell according to the present invention, it is possible to provide a thermoelectric conversion device using an inexpensive and safe general-purpose thermoelectric material without using toxic bismuth telluride ($Bi_2 Te_3$), and a technology base for thermoelectric generation to spread widely can be achieved.

In accordance with the thermoelectric generation cell according to the present invention, the device structure for maximizing the performance of a general-purpose thermoelectric material makes it possible to develop and spread thermoelectric generation without competing with the development of an existing thermoelectric material.

REFERENCE SIGNS LIST 1, 101 first thin metal plate
2, 102 second thin metal plate
3, 103 insulation film
4, 24 first wire
5, 25 second wire
6, 106, 206, 306, 326 joining surface (high temperature contact)

7, 107, 207, 307a, 307b cold contact (low temperature contact)
8, 28, 48, 108 heat collection plate
9, 29, 49, 109, 209, 309a, 309b heat sink
10, 50, 110, 210, 310 fire-resistant-material frame
11, 31, 51, 111, 211, 311 heating section
12, 32, 52, 112 cooling section
133, 233, 333 negative terminal
134, 234, 334 positive terminal
104, 204, 304 first extension conductor
105, 205, 305 second extension conductor
201, 301 first band-shaped metal sheet
202, 302 second band-shaped metal sheet
203, 303, 323 insulation layer
212, 312a, 312b cooling insulation oil section
213, 313a, 313b radiation fin
214, 314 upper opening
215, 315 lower opening
321 third band-shaped metal sheet
322 fourth band-shaped metal sheet
324 third extension conductor
325 fourth extension conductor

The invention claimed is:

1. A thermoelectric generation cell comprising:
a plurality of stacked bodies formed by stacking thermoelectric generation units;
a heat collection plate (8) provided on a side of a heating section (11) of the plurality of stacked bodies; and
a heat sink (9) provided on a side of a heat radiation section of the plurality of stacked bodies, wherein
each of the thermoelectric generation units includes
a first metal plate (1) with a thickness of 0.1 to 3 mm,
a second metal plate (2) with a thickness of 0.1 to 3 mm joined to the first metal plate (1),
an insulation film (3) overlapped on an opposing surface of the second metal plate, the opposing surface being opposed to a joining surface (6) between the first and second metal plates,
a first wire (4) connected to the first metal plate (1), the first wire (4) being formed of a same material as a material of the first metal plate (1),
a second wire (5) connected to the second metal plate (2), the second wire being formed of a same material as a material of the second metal plate (2), and
a cold contact point (7) at which end portions of the first and second wires are connected, the end portions are different ends opposite to end portions connected to the first and second metal plates,
a joining area between the first metal plate (1) and the second metal plate (2) is larger than a joining area of the cold contact point,
the thermoelectric generation cell using thermoelectric generation by a Seebeck effect,
a temperature difference holding section that maintains a temperature difference between a high temperature portion and a lower temperature portion is provided by connecting the first metal plate and the second metal plate to the cold contact point with the first wire and the second wire, and
a metal having an electric resistivity of not more than 70 μΩ·cm and a thermal conductivity of not less than 60 W/m·K is used as the first metal plate (1), and a metal having an electric resistivity of not more than 70 μΩ·cm and a thermal conductivity of not more than 40 W/m·K is used as the second metal plate (2).

2. The thermoelectric generation cell according to claim 1, further comprising
a cooling section (12) that cools the cold contact point (7) provided in each of the thermoelectric generation units in units of several groups or collectively.

3. The thermoelectric generation cell according to claim 1, wherein
an insulation material has plasticity and absorbs thermal displacement between stacked layers is used as the insulation film of the thermoelectric generation cell.

4. The thermoelectric generation cell according to claim 1, wherein
the first and second metal plates (1, 2) have a structure in which the insulation film is sandwiched inside fire-resistant-material frames (10).

5. A thermoelectric generation module, characterized in that
a plurality of the thermoelectric generation cells according to claim 1 are arranged so that a stacked direction of the thermoelectric generation cells is perpendicular to a heating surface.

* * * * *